(12) United States Patent
Mendel et al.

(10) Patent No.: US 9,941,903 B1
(45) Date of Patent: Apr. 10, 2018

(54) DISTRIBUTED BURST ERROR PROTECTION

(71) Applicant: Altera Corporation, San Jose, CA (US)

(72) Inventors: David W. Mendel, San Jose, CA (US); Gregg William Baeckler, San Jose, CA (US)

(73) Assignee: Altera Corporation, San Jose, CA (US)

( * ) Notice: Subject to any disclaimer, the term of this patent is extended or adjusted under 35 U.S.C. 154(b) by 148 days.

(21) Appl. No.: 14/597,090

(22) Filed: Jan. 14, 2015

Related U.S. Application Data

(62) Division of application No. 13/310,628, filed on Dec. 2, 2011, now Pat. No. 8,943,393.

(51) Int. Cl.
*H03M 13/00* (2006.01)
*H03M 13/17* (2006.01)
*G06F 11/07* (2006.01)

(52) U.S. Cl.
CPC .......... *H03M 13/17* (2013.01); *G06F 11/076* (2013.01)

(58) Field of Classification Search
CPC ...................... H04L 1/0072; H04L 2001/0096
See application file for complete search history.

(56) References Cited

U.S. PATENT DOCUMENTS

| | | | |
|---|---|---|---|
| 4,357,700 A | 11/1982 | Alvarez et al. | |
| 4,417,339 A | 11/1983 | Cantarella | |
| 6,675,344 B1 | 1/2004 | Sharma | |
| 7,085,282 B2 | 8/2006 | Belotserkovsky et al. | |
| 7,313,153 B2 | 12/2007 | Sugaya | |
| 7,668,224 B2 | 2/2010 | Hocevar et al. | |
| 8,139,304 B2 | 3/2012 | Cideciyan et al. | |
| 2003/0043749 A1* | 3/2003 | Tanaka | H03M 13/00 370/241 |
| 2006/0018343 A1* | 1/2006 | Rodrigo | H04Q 11/0066 370/471 |
| 2010/0031120 A1* | 2/2010 | Belogolovy | H03M 13/17 714/762 |

OTHER PUBLICATIONS

Oida, K., et al., "A packet-size aware routing algorithm for parallel transmission server system," Parallel and Distributed Processing Symposium., Proceedings 15th International, Apr. 2001, 7 pgs.

* cited by examiner

*Primary Examiner* — Guy Lamarre
(74) *Attorney, Agent, or Firm* — Compass IP Law PC (57) ABSTRACT

A method of protecting digital words traversing multiple data paths is presented. The method identifies a number of bits for a header of a digital word and determines a number of protection bits for the header. A bit value for each of the protection bits is computed, and the computed bit values of the protection bits are transmitted through one or more data paths.

15 Claims, 5 Drawing Sheets

| | |
|---|---|
| 20A (Data path 1) → | [header1][payload1] |
| 20B (Data path 2) → | [header2][payload2] |
| 20C (Data path 3) → | [header3][payload3] |
| 20D (Data path 4) → | [header4][payload4] |
| 20E (Data path 5) → | [parity] |

FIG 4

| | | |
|---|---|---|
| 20A (Data path 1) | 0010110 | |
| 20B (Data path 2) | 1010010 | FIG 5A |
| 20C (Data path 3) | 0101010 | Prior to |
| 20D (Data path 4) | 1011010 | Transmission |
| 20E Parity | 0110100 | |

| | | |
|---|---|---|
| 20A (Data path 1) | 0010110 | |
| 20B (Data path 2) | 1010010 | FIG 5B |
| 20C (Data path 3) | 0101110 | During |
| 20C (Data path 4) | 1011010 | Transmission |
| 20 E Parity | 0110100 | |

DISTRIBUTED BURST ERROR PROTECTION

BACKGROUND

Many communication protocols employ encoding techniques that incorporate header bits before a payload in a digital word. Exemplary encoding schemes include Ethernet, Interlaken, and peripheral component interconnect express (PCIe) gen3, each of which includes a two or three bit header with a payload. Typically, error detection/correction codes may be used to detect or correct payload errors and not the header bits that occur during data transmission. Error detection/correction codes include cyclic redundancy checks (CRC), along with error-correcting code (ECC), such as forward error correction (FEC). The error correction code can ensure that errors in consecutive bits of the payload, i.e., a burst error, will be detected or corrected.

Header bits are used to interpret the payload associated therewith. Accordingly, misinterpretation or corruption of the header bits can cause the associated payload to be interpreted incorrectly. In other words, corruption of the header bits can lead to misinterpretation of the payload bits even in presence of the error correction code. Therefore, if the integrity of the header associated with the payload is not maintained, there is no guarantee that the error detection code can detect or correct an error in the payload.

SUMMARY

According to embodiments herein, a method and apparatus provide distributed redundancy bits, also referred to as protection bits, for header bits in order to protect the header from error corruption. In one embodiment, protection bits are distributed in a location different than the header location. It should be appreciated that the embodiments can be implemented in numerous ways, including as a method, a system, or a device. Several exemplary embodiments are described below.

In accordance with one exemplary embodiment, a method of protecting digital words traversing multiple data paths is described. The method identifies a number of header bits for a header of a digital word and determines a number of protection bits for the header. A bit value for each of the protection bits is computed, and the computed bit values of the protection bits are distributed among the data paths.

In accordance with another exemplary embodiment, a method for protecting header bits of a digital word along with the word itself using a parity bit is provided. The method identifies a bit error rate for each data path. A parity bit, enabling detection of an unintended change in a header, is received. The bit in the header is compared to a the parity bit. In response to a mismatch between at least one of the header bits and the parity bit, adjusting a bit value associated with the at least one of the header bits in the data path with a highest bit error rate is performed.

Other aspects and advantages of the embodiments will become apparent from the following detailed description, taken in conjunction with the accompanying drawings, illustrating by way of example the principles of the embodiments.

BRIEF DESCRIPTION OF THE DRAWINGS

The embodiments, together with further advantages thereof, may best be understood by reference to the following description taken in conjunction with the accompanying drawings.

DETAILED DESCRIPTION

The following embodiments describe exemplary apparatus and method for distributing protection bits in a digital word in order to protect header bits from unrecoverable error corruption. It will be obvious, however, to one skilled in the art, that the embodiments may be practiced without some or all of these specific details. In other instances, well known process operations have not been described in detail in order not to unnecessarily obscure the embodiments.

Figure 1:
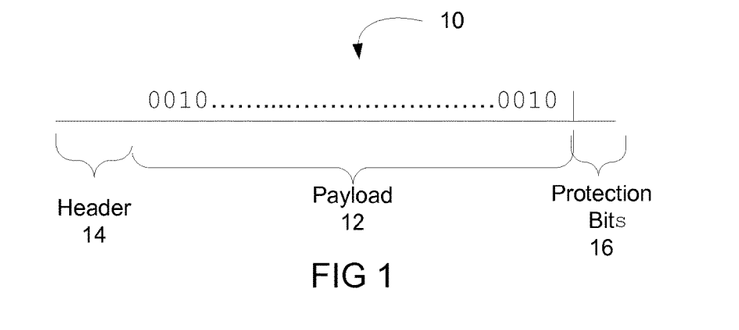
FIG. 1 illustrates an exemplary diagram of a digital word with a protection bit in accordance with one exemplary embodiment.

Embodiments described below provide protection for header bits from unrecoverable error corruption in any suitable communication protocol. The header bits are used in interpreting a payload of a digital word. The embodiments described below may be implemented by adding protection bits for recovery of the header of a digital word should an error in the header occur. Ability to recover header bits from burst errors may be further enhanced by separating the protection bits from the associated header. It should be appreciated that the embodiments described below are generally applicable irrespective of the method used to calculate the number of the protection bits and values thereof, so long as the protection bits are distributed in a manner that separates the protection bits from the associated header. Any error correction code (ECC) code can be used to implement the embodiments described below. As such, using Hamming codes is exemplary and is not intended to limit the scope of the present invention FIG. 1 illustrates an exemplary diagram of a digital word with a protection bit in accordance with one exemplary embodiment. Digital word 10 includes a sequence of data bits or a payload 12 with associated header 14. The associated header 14 may be used to convey information about the payload 12 to the receiving circuit. For example, the header 14 bit values can indicate if the payload 12 is either a control payload or data payload depending on the communication protocol governing the data transmission. In one embodiment, the data path can be a data path that traverses through a high speed serial interface (HSSI) of an integrated circuit.

In one embodiment, the header 14 bit values may be correctly recovered, even in presence of one or more errors, by introducing added protection for the recovery for the header bits. For example, protection bits 16 may be added to the digital word 10 in order to provide added protection for the recovery that may be used to detect and correct errors in the header 14 bits. The protection bits 16 may be a result of combining one or more of the header 14 bits. It should be appreciated that depending on the protection scheme, protecting the individual bit values of the header 14 is not essential, so long as the combined state of the header 14 bits is preserved. For example, instead of protecting each bit in isolation, a combination of header 14 bits may be protected, thereby improving efficiency. In another embodiment, since a burst error may affect consecutive bits of the digital word 10, placing the protection bits 16 and the header 14 on opposite ends of the digital word 10 improves the ability to recover the header bits 14 even in presence of a burst error affecting both the protection bits 16 and the header 14 bits. It should be appreciated that the protection bits 16 may be positioned in any position of the digital word 10 as long as the manner in which the protection bits 16 that introduce redundancy to the header 14 bits is maintained.

A number of bits between the header 14 bits and the protection bits 16 are referred to as the distance between the two. The distance provides protection against the number of error bits that define the distance. For example, if the distance between the header 14 bits and the protection bits 16 is 10 bits, then the scheme enables header bits to be successfully recovered even in presence of a burst error of up to 10 bits.

Figure 2:
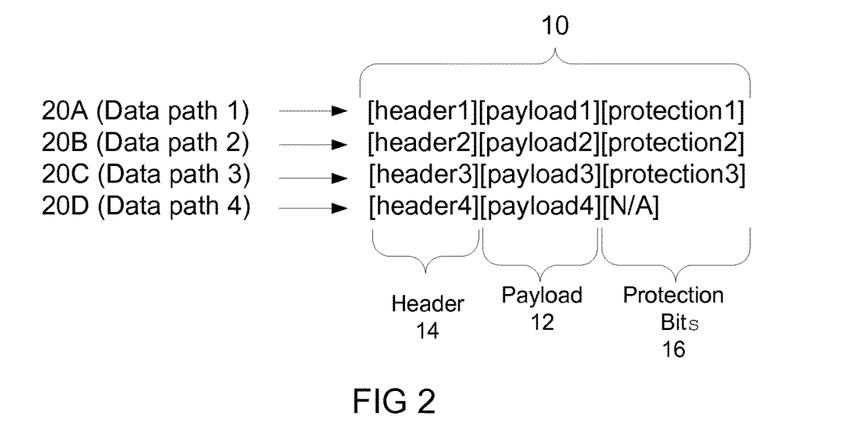
FIG. 2 illustrates an exemplary diagram of a header protection schemes in multiple data paths in accordance with exemplary embodiments of the present invention.

FIG. 2 illustrates an exemplary diagram of a header protection schemes in multiple data paths in accordance with exemplary embodiments. Often digital data is transmitted over a number of parallel data paths 20A-D. However, a burst error typically does not occur in more than one data path 20A-D contemporaneously. In one embodiment, the protection bits 16 and the header 14 bits are positioned on opposite ends of the payload 12 and the protection bits 16 can be distributed among multiple data paths 20A-D. In one embodiment, data being transmitted in at least one data path, e.g., data path 4 20D, of multiple paths may not have a corresponding protection bit associated therewith. In one embodiment, each of the multiple data paths is a differential serial data path A minimum number of protection bits 16 that can be used to protect the bits of the header 14 can be determined based on the total number of bits of the header 14 across all lanes. In an exemplary embodiment, an error correction code such as the Hamming code can be used to calculate and compute the value of each of the three bits (protection1, protection2, and protection3) of the protection bits 16 protecting the four bits of the header 14 associated with payload 12 transmitted over multiple data paths 20A-D. It is appreciated that the number of header bits, the number of protection bits, the number of data paths, etc., are exemplary and not intended to limit the scope of the present invention. It should be appreciated that Hamming code can detect up to two simultaneous bit errors and correct single-bit errors. Hamming distance is referred to as the number of bit positions in two bit sequences with different bit values. Therefore, a burst error corrupting two bits of a bit sequence would have a Hamming distance of 2. Hamming code facilitates reliable communication when the Hamming distance between a transmitted and received sequence of bits is less than or equal to one. A Hamming code is one exemplary error correcting code and is not intended to be construed as limiting the scope of the present invention. For example, other error correcting codes such as BCH, Reed-Solomon, Turbo codes, etc., may be used instead.

For example, using the Hamming code, it may be determined that three protection bits 16 (protection1, protection2, and protection3) provides protection to detect and correct an error in the four bits of the header 14 (header1, header2, header3, and header4) in the data paths 20A-D. This Hamming code is commonly referred to as a Hamming (7,4) code. In one embodiment, the header 14 bits of all the data paths 20A-D are aggregated together and the protection bits 16 are computed. In another embodiment, the protection bits 16 are added to the end of the payload of the digital word 10 opposite the header 14. Still further, the protection bits 16 are distributed such that there is one protection bit per data path 20A-C, except for the last data path 20D. It should be appreciated that the protection bits 16 can be arbitrarily distributed among the data paths 20A-D as opposed to being on the same data path as the payload or header for which the protection bits are providing the added recovery. In one embodiment, the protection bits 16 and the header bits 14 for a single data lane are spread apart within the data lane so that a single burst error impacts as few of the header bits and the protection bits as possible. It should be further appreciated that any ECC can be used to calculate the number and the values of the protection bits 16.

The protection bits may be distributed if the number of header 14 bits is greater than the number of data paths 20A-D. For example, if more than four header 14 bits are associated with the payloads 12 in data paths 20A-D, these bits of the header 14 can be protected using four protection bits 16, where the number of protection bits in this instance (4) are determined by the Hamming Code. That is, a Hamming (11,7) code may be used where seven header 14 bits are protected by using four protection bits 16.

Figure 3:
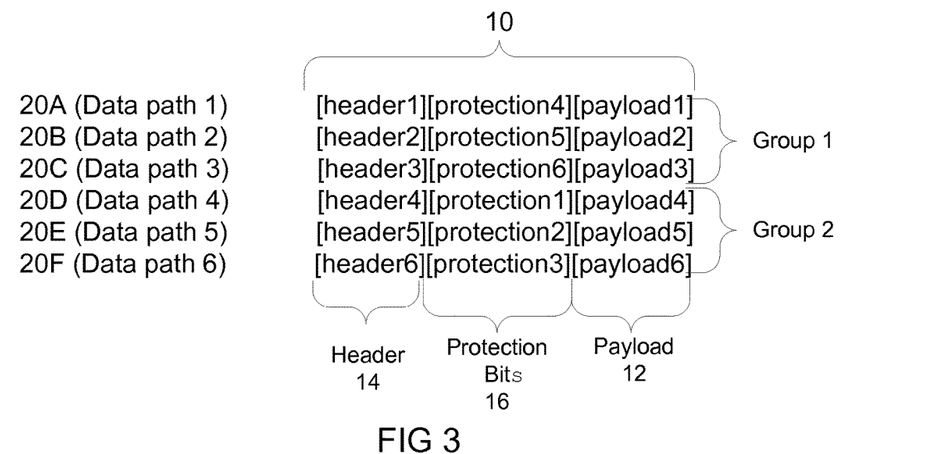
FIG. 3 illustrates an exemplary diagram of a header protection scheme using grouped protection bits in multiple data paths in accordance with exemplary embodiments of the present invention.

FIG. 3 illustrates an exemplary diagram of a header protection scheme using grouped protection bits in multiple data paths in accordance with exemplary embodiments. For data that is transmitted over a large number of data paths 20A-F, the protection bits 16 and the header 14 bits can be formed into groups. For example, for six data paths 20A-F, the digital words 10 can be divided into two groups, Group 1 and Group 2. In one embodiment, a group of protection bits 16 associated with their corresponding header 14 bits are transmitted through different data paths. For example, the protection bits 4-6 associated with the header bits 4-6 may be transmitted along with header bits 1-3 in Group 1 on data paths 20A-C. Similarly, protection bits 1-3 associated with the header bits 1-3 may be transmitted along with the header bits 4-6 in Group 2 on data paths 20D-F, as depicted in FIG. 3.

In another embodiment, the protection bits 4-6 can be placed adjacent to the header bits 1-3 in group 1 since protection bits 4-6 associated with the header bits 4-6 are transmitted on different data paths. It should be appreciated that locating the protection bits 16 closer to the front of a digital word 10 reduces the latency in decoding the message, since the header 14 is more readily available, i.e., accessible to the decoding apparatus as opposed to the header being located at the end of the digital word. The location of the protection bits 16 relative to the header 14 bits is for illustrative purposes and not intended to limit the scope of the present invention. In one embodiment the protection bits 16 can be located in any position of the digital word 10, so long as the protection bits 16 are transmitted in a data path different from header 14 bits associated therewith. For example, protection bits 4 may be positioned in data path other than data path 4 because header bits 4 are being transmitted on data path 4. The distributed group protection scheme can also be applied in situations where the number of data paths 20A-F is such that equally sized groups cannot be formed. For example, in a case where seven data path are employed, bits of the header 14 associated with the payload 12 in the seventh data path can be protected using the protection bits 16 of Group 2 where the seventh data path may not have a protection bit if the number of protection bits 16 is less than the number of data paths 20A-F, as illustrated in FIG. 2.

Figure 4:
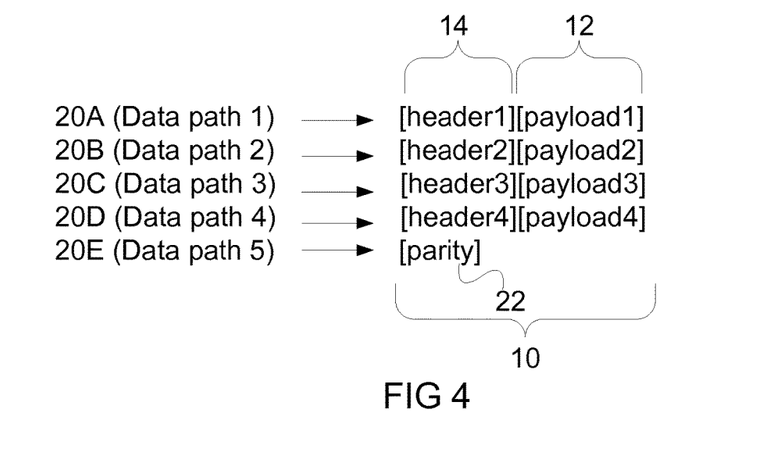
FIG. 4 illustrates an exemplary diagram of a parity bit protection scheme in multiple data paths in accordance with one exemplary embodiment.

FIG. 4 illustrates an exemplary diagram of a parity bit protection scheme in multiple data paths in accordance with one exemplary embodiment. The header 14 bits associated with the payload 12 of the digital word 10 are transmitted on data paths 20A-D. The header 14 bits and the payloads 12 are transmitted on data paths 20A-D while a parity bit 22 for protecting the header 14 bits is transmitted on data path 20E. In one embodiment, the number of parity bits 22 is the same as the number of header 14 bits. It should be appreciated that digital paths 20A-E can have differing error rates. Burst error impacts the data path 20A-D with the highest error rate. The parity bit 22 may be used to correct the bit values of the header 14 and the payload 12 in the data path 20A-D with the highest error rate. Transmitting the parity bit 22 in the same data paths 20A-D as the header 14 bits may expose the parity bit 22 along with the header 14 and payload 12 to a burst error. Accordingly, transmitting the parity bit 22 in a data path, e.g., data path 20E, separate from the transmission data paths, e.g., data paths 20A-D, of the header 14 bits and the payload reduces the likelihood of corruption of the parity bit 22, the payload 12, and the header 14 by a burst error at the same time.

Figure 5A:
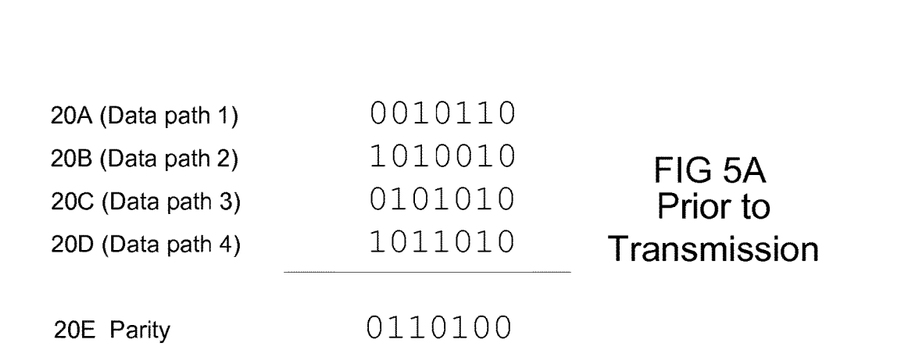
FIGS. 5A-B illustrate exemplary header protection using a parity bit protection scheme in multiple data paths in accordance with one exemplary embodiment.
Figure 5B:
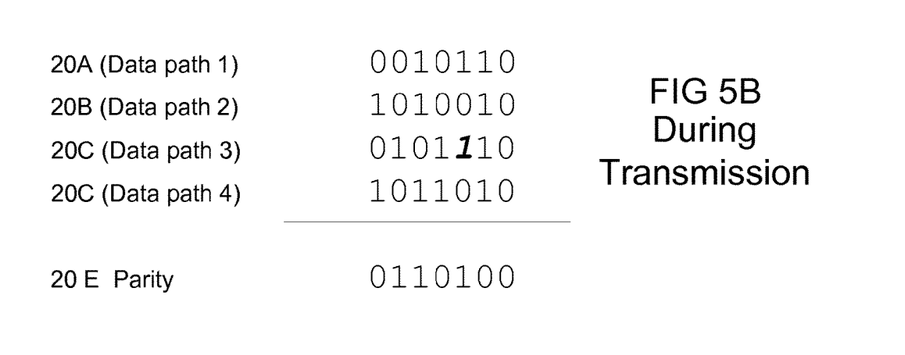

FIGS. 5A-B illustrate exemplary header protection using a parity bit protection scheme in multiple data paths in accordance with one exemplary embodiment. Prior to transmission, bit sequences in the respective data paths 20A-E are shown FIG. 5A. The bit sequences of data paths 20A-20D represent header bit sequences in one embodiment. In one embodiment, the value of each parity bit is calculated based on the bit values of its corresponding header bits in each data path 20A-D. For example, to calculate the value of the first parity bit, the first header bit in each of the data paths 20A-D with a value of "1" is summed. In the first bit in the data paths 20A-D, the number of bits with a value of "1" is 2, which is an even number, resulting in a corresponding value of the first parity bit of "0". In another example, to calculate the value of the second parity bit, the number of header bits in the second position with a value of "1" is 1, which is odd, resulting in a corresponding value of the second parity bit of "1". The remaining parity bits are calculated in a similar fashion. It is, however, appreciated that the values of the parity bits may be calculated based on other values, e.g., "0" value. As such, calculating the parity bits based on the number of header bits with a value of "1" is exemplary and not intended to limit the scope of the present invention.

FIG. 5B illustrates exemplary bit patterns in data paths 20A-E after an unintended change in the bit values. Comparing the bit sequences in FIGS. 5A and 5B, it should be noted that the value of the fifth bit in the bit sequence in data path 3 20C has "flipped" from "0" to "1". To detect this error in the header bit sequences in the data paths 20A-D, the number of header bits with a value of "1" at each position is compared with the value of the corresponding parity bit 22 in data path 20E. In this example, for the fifth bit position from the left in the header bit sequences of data paths 20A-D with a value "1" is 2 after the error. The number of header bits in the fifth position with a value of "1" is inconsistent with the value of the corresponding parity bit 22 as discussed above, thereby indicating that an error has occurred in the fifth header bit position. In one embodiment, the bit in the data path 20A-D that has the highest error rate, e.g., data path 20C, is adjusted or modified to be consistent with the value of the parity bit 22 in that position. For example, referring to FIG. 5B and assuming that data path 3 20C has the highest error rate, the value of the fifth bit in the header bit sequence in data path 3 20C would be adjusted from "1" to "0", thereby correcting the error. It should be appreciated that unlike the protection bit schemes discussed above with respect to FIGS. 1-3, the parity protection scheme described in FIGS. 4 and 5A-B protects the state of each bit of the header, and not the aggregated state of the header bits. It should be further appreciated that the parity protection scheme can be employed to protect the header bits as well as the payload transmitted on the data paths 20A-D.

Figure 6:
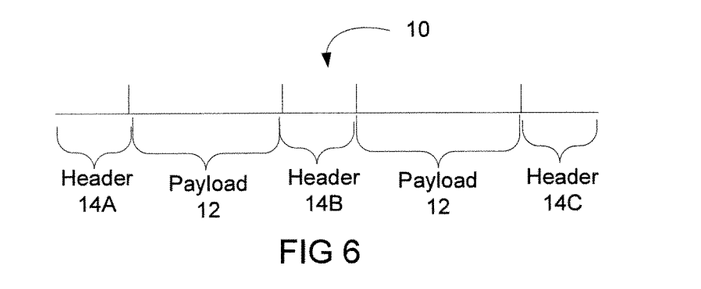
FIG. 6 illustrates an exemplary diagram of multiple header protection schemes in a single data path in accordance with one exemplary embodiment.

FIG. 6 illustrates an exemplary diagram of multiple header protection schemes in a single data path in accordance with one exemplary embodiment. The integrity of the payload 12 can be further enhanced by distributing identical copies of the header 14A-C to different locations within the digital word 10, e.g., header 14A at the beginning, header 14B in the middle, and header 14C at the end of the digital word 10. Distributing the identical copies of the header 14A-C throughout the digital word 10 increases the probability that at least the majority of the copy of the header 14A-C would be unaffected by a burst error. In one embodiment, the minimum distance between adjacent copies of the header 14A-B and 14B-C is defined by the maximum burst length that protection is desired.

After the digital word 10 is transmitted over the data path, the headers 14A-C associated with the payload 12 are evaluated or "polled." By positioning each copy of the header 14A-C at the maximum burst length from one another, the majority of the copies of the header 14A-C would be unaffected by a burst error. For instance, at most one copy of the header 14A-C, for instance 14A, can be corrupted by a burst error, while the other copies of the header 14B-C should be unaffected in this embodiment. Analyzing the bits of the header 14A-C of the digital word 10 would determine that the first copy of the header 14A is different than the other two copies of the header 14B-C as a result of the burst error. In one embodiment, the values of the header bits are determined based on the majority of the copies of the header bits. For example, if two headers, e.g., headers 14B and 14C, have the same values but differ from a third header 14A value, then the header values are selected as indicated by either of the two headers having the same values, e.g., either header 14B or header 14C.

Figure 7:
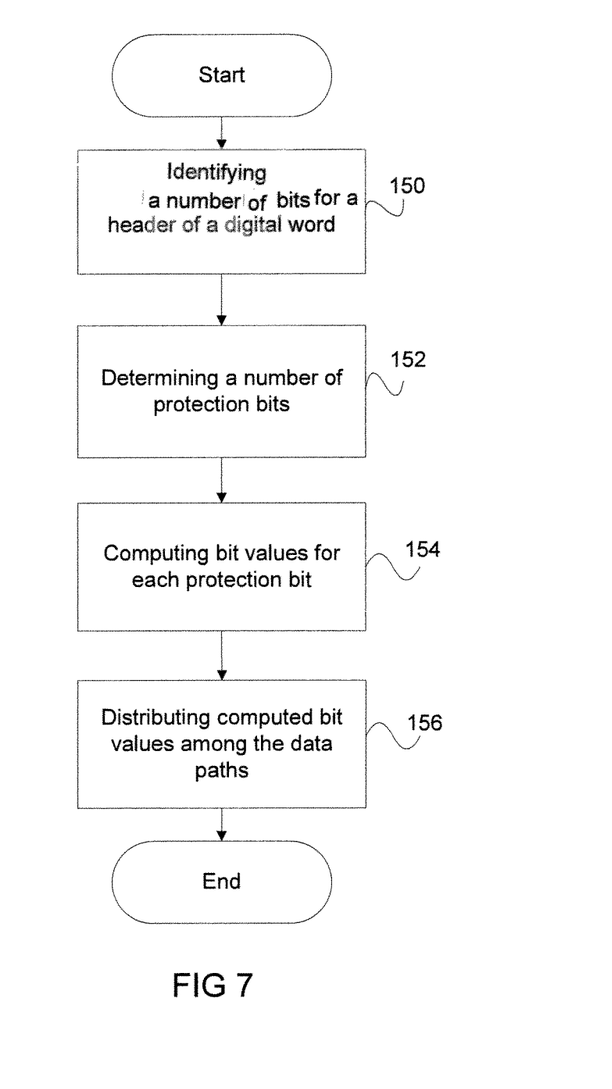
FIG. 7 is an exemplary flow diagram for protecting a header using distributed protection bits in accordance with one exemplary embodiment.

FIG. 7 is an exemplary flow diagram for protecting a header using distributed protection bits in accordance with one exemplary embodiment. At step 150, a number of header bits is identified. At step 152, a number of protection bits is determined. In one embodiment, the number of protection bits is determined based on the number of header bits, as determined in step 150. For example, four header bits can be protected with three protection bits using an ECC, e.g., a Hamming (7,4) code. In operation 154, the bit value for each of the protection bits is computed. In one embodiment, the values of the protection bits are calculated by combining the header bits using an ECC, e.g., Hamming code. As discussed in FIG. 2, in the case where there are four bits of the header, a Hamming (7,4) code can be used. The Hamming (7,4) code calculates the value of three protection bits to protect four header bits. It should be appreciated that the distributed protection bit scheme can be implemented using any ECC. As such, using a Hamming code is for illustrative purposes only and not intended to limit the scope of the present invention.

The computed protection bit values are distributed among the data paths, in operation 156. In one embodiment, the computed protection bit values and the corresponding header are placed in different locations within the data path, i.e., the header may be at the beginning of the word being transmitted and the protection bits are placed at the end of the word being transmitted over the same data path. Still further as illustrated in FIG. 2, the headers and the computed protection bits may be separated by the width of the payload in the same data path, in one embodiment. As a result, a receiving component can correct one or more errors in the headers by using the transmitted protection bits.

Figure 8:
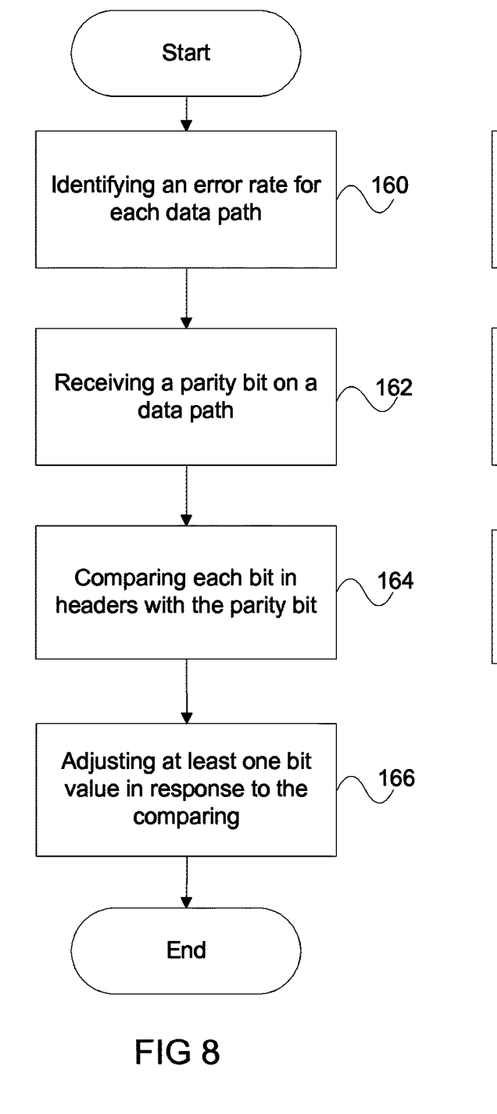
FIG. 8 is an exemplary flow diagram il for protecting a header using parity bits in accordance with one exemplary embodiment.

FIG. 8 is an exemplary flow diagram for protecting a header using parity bits in accordance with one exemplary embodiment. At step 160, a bit error rate for each data path is determined. In operation 162, one or more parity bits are received by a receiving component through the data paths. In one embodiment, the parity bit enables the receiving component to detect and correct an error that has occurred in one or more header bits during transmission, as illustrated in FIGS. 5A-B. In one embodiment, the parity bit is computed by combining header bits. For example, in one embodiment as illustrated in FIGS. 5A-B, the value of the parity bit for each position depends on the number of associated header bits with a value of "1".

In one embodiment, digital words and one or more parity bits that are transmitted over the data paths are received by a receiving source. During data transmission, one or more header bits of one or more of the digital words being transmitted through multiple data paths may change values due to a burst error in one of the multiple data paths, causing an error in one or more header bits.

At step 164, each header bit is compared to the received parity bit. In one embodiment, the receiving source can analyze the header bits to determine if the header bit values are consistent with the parity bit values, as illustrated in FIGS. 5A-B. At step 166, one or more bits of the header bits received through the data path with the highest bit error rate is changed in response to a mismatch between a calculated parity bit value at the receiving end and the received parity bit value that was calculated by the transmitting component, as illustrated in FIGS. 5A-5B. In one embodiment, the bit error rate for the data paths are compared and periodically monitored. It should be appreciated that the data path with the historically highest error rate can change due to a variety of factors, such as variation in temperature.

Figure 9:
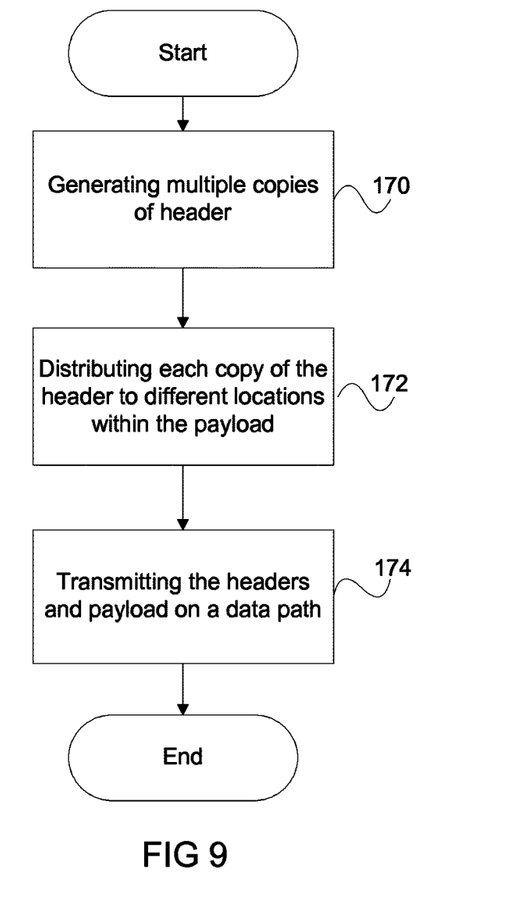
FIG. 9 is an exemplary flow diagram illustrating a multiple header protection scheme in accordance with one exemplary embodiment.

FIG. 9 is an exemplary flow diagram illustrating a multiple header protection scheme in accordance with one exemplary embodiment. At step 170, multiple identical copies of the header bits associated with a payload are generated, as illustrated in FIG. 6. In operation 172, each copy of the header is distributed to a different location within the word containing the payload to be transmitted over a data path. For example, one identical copy of the header may be positioned at each of the beginning, one in the middle, and one in the end of the word to be transmitted, as illustrated in FIG. 6. In operation 174, the headers and the payload are transmitted on a data path from a transmitting component to a receiving component. In one embodiment, each header is analyzed by the receiving component. The bit values of each of the received header copies are compared to one another. The bit values as identified by the majority of the copies of the header bits are selected as the header bit values. For example, as discussed in FIG. 6, each header of a payload with three copies of the header is analyzed. If one copy of the header has been affected by a burst error, the copy of the header that differs from the rest of the copies is disregarded. The remaining copies of the header are used to interpret the payload.

Figure 10:
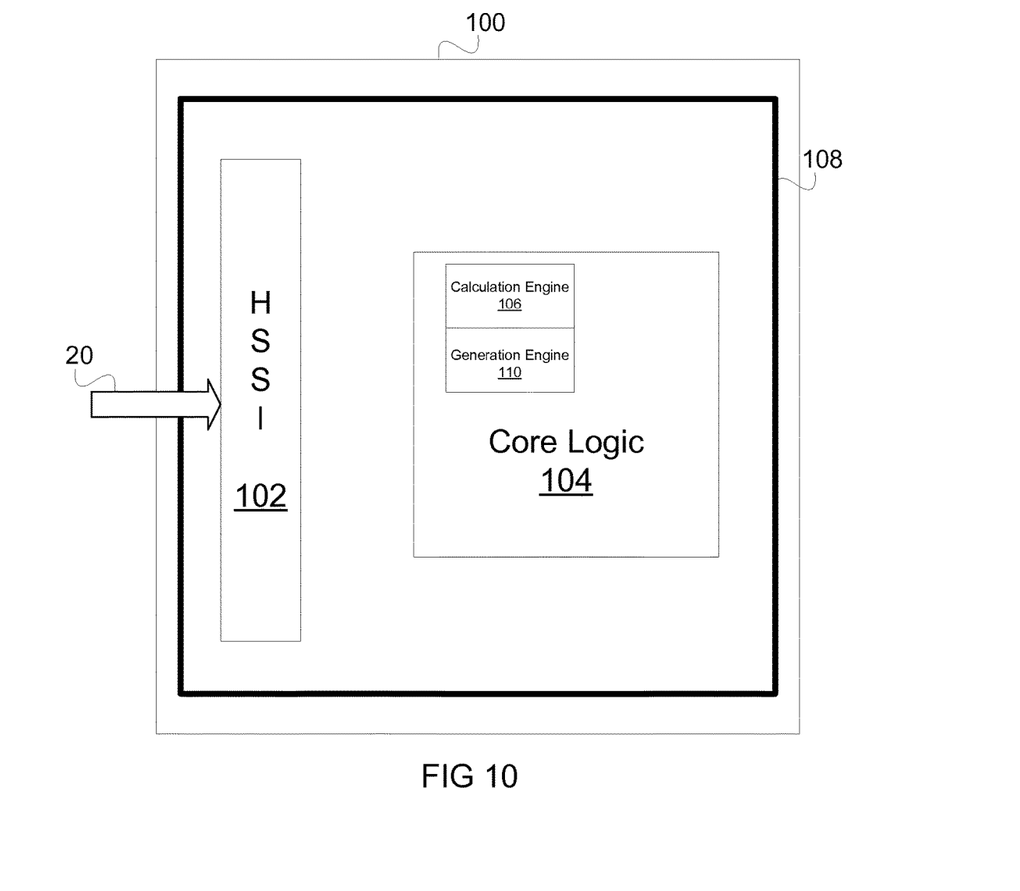
FIG. 10 illustrates an exemplary diagram of an integrated circuit used for implementing header protection schemes in accordance with one exemplary embodiment.

FIG. 10 illustrates an exemplary diagram of an integrated circuit used for implementing header protection schemes in accordance with one exemplary embodiment. An integrated circuit (IC) 100 includes an input/output (I/O) ring 108 with contains circuits which transmit and receive signals between a core logic 104 and a high speed serial interface (HSSI) 102, and the rest of the system. The exemplary ICs 100 can include processors, application specific integrated circuits (ASICs) or programmable logic devices. It should be appreciated that any known I/O standards, whether single ended or differential, may be supported by the input/output circuitry of the I/O ring 108, such as low-voltage differential signaling (LVDS), transistor-transistor logic (TTL), etc., standards. In one embodiment, the HSSI 102 of the IC 108 includes several data paths 20 or lanes, which can be used to transmit bit sequences in the form of digital words. In one embodiment, the data paths 20 are serial data paths. Still further, the serial data paths 20 are high speed optical links, in one embodiment.

The core logic 104 of the integrated circuit 100 may include a calculation engine 106 and a generation engine 110. In one embodiment, the calculation engine 106 includes logic to determine a number of protection bits, where the number of protection bits corresponds to the number of bits of the header of the payloads in the data paths. Still further, the calculation engine 106 functions to combine the bits of the header, in one embodiment. In another embodiment, the generation engine 110 includes logic that computes a bit value for each of the number of protection bits using the combined bits of the header from the calculation engine 106. The generation engine 110 is also capable of distributing the computed values of the protection bits among the data paths 20.

The method and apparatus described herein may be incorporated into any suitable circuit, including processors and programmable logic devices (PLDs). The PLDs can include programmable array logic (PAL), programmable logic arrays (PLAs), field programmable logic array (FPLAs), electrically programmable logic devices (EPLDs), electrically erasable programmable logic devices (EEPLDs), logic cell arrays (LCAs), field programmable gate arrays (FPGAs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the PLDs owned by the assignee.

The embodiments may be practiced with other computer system configurations including hand-held devices, microprocessor systems, microprocessor-based or programmable consumer electronics, minicomputers, mainframe computers and the like. The embodiments may also be practiced in distributed computing environments where tasks are performed by remote processing devices that are linked through a network.

With the above embodiments in mind, it should be understood that the embodiments may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the embodiments are useful machine operations. The embodiments also relate to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

The embodiments can also be defined as a machine that transforms data from one state to another state. The transformed data can be saved to storage and then manipulated by a processor or through hardware logic of a PLD configured to perform or execute functionality as mentioned with reference to FIG. 10. The processor or hardware logic thus transforms the data from one thing to another. Still further, the methods can be processed by one or more machines or processors that can be connected over a network. Each machine can transform data from one state or thing to another, and can also process data, save data to storage, transmit data over a network, display the result, or communicate the result to another machine.

The embodiments can also be embodied as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, DVDs, Flash, magnetic tapes, and other optical and non-optical data storage devices. The computer readable medium can also be distributed over a network coupled computer systems so that the computer readable code is stored and executed in a distributed fashion.

Although the foregoing embodiments have been described in some detail for purposes of clarity of understanding, it will be apparent that certain changes and modifications can be practiced within the scope of the appended claims. Accordingly, the embodiments are to be considered as illustrative and not restrictive, and the embodiments are not to be limited to the details given herein, but may be modified within the scope and equivalents of the appended claims.

What is claimed is:

1. A method for protecting digital words with header redundancy comprising:
   generating a plurality of identical headers that are each a copy of a header associated with a payload, wherein the identical headers are generated to be identical to each other;
   inserting each of the plurality of identical headers at different locations within the payload to form a digital word, wherein a minimum distance between the different locations of the identical headers within the payload is a maximum burst length; and
   transmitting the digital word, including the payload and the plurality of identical headers at the different locations within the payload, wherein at least one of the method operations is executed by hardware logic,
   wherein the transmitted digital word is received and decoded in a decoding apparatus.

2. The method for protecting digital words with header redundancy of claim 1, wherein the inserting comprises:
   inserting a first identical header of the plurality of identical headers at a beginning of the payload and a second identical header of the plurality of identical headers at an end of the payload.

3. The method for protecting digital words with header redundancy of claim 1, wherein inserting comprises:
   inserting an identical header of the plurality of identical headers at substantially a middle of the payload.

4. The method for protecting digital words with header redundancy of claim 1, further comprising:
   receiving the digital word having a plurality of received headers inserted therein, and
   analyzing bits of each received header of the plurality of received headers.

5. The method for protecting digital words with header redundancy of claim 4, further comprising:
   determining a first received header of the plurality of received headers is different than a second received header of the plurality of received headers, based on the analyzing; and
   selecting the first received header based on bits of a third received header of the plurality of received headers having a same value as bits of the first received header.

6. The method for protecting digital words with header redundancy of claim 1, further comprising:
   positioning each of the plurality of identical headers at positions in the payload that are the maximum burst length apart from one another.

7. An integrated circuit that protects digital words with header redundancy, the integrated circuit comprising:
   logic circuitry that generates a plurality of identical headers associated with a payload, wherein the headers in the plurality of identical headers are generated to be identical to each other;
   logic circuitry that inserts each of the plurality of identical headers at different locations within the payload to form a digital word, wherein a minimum distance between the different locations of the identical headers within the payload is a maximum burst length; and
   logic circuitry that transmits the digital word, wherein the transmitted digital word is received and decoded in a decoding apparatus.

8. The integrated circuit of claim 7, wherein a first identical header of the plurality of identical headers is inserted at a beginning of the payload, and a second identical header of the plurality of identical headers is inserted at an end of the payload.

9. The integrated circuit of claim 7, wherein an identical header of the plurality of identical headers is inserted at substantially a middle of the payload.

10. The integrated circuit of claim 7, wherein the different locations of the plurality of identical headers are positioned in the payload at the maximum burst length apart from one another.

11. A system for protecting digital words with header redundancy comprising:
   a first device configured to:
      generate a plurality of identical headers associated with a payload, wherein the identical headers are generated to be identical to each other;
      insert each of the plurality of identical headers at different locations within the payload to form a digital word, wherein a minimum distance between the different locations of the identical headers within the payload is a maximum burst length; and
      transmit the digital word, including the payload and the plurality of identical headers at the different locations within the payload; and
   a second device configured to:
      receive and decode the digital word, including a received payload and a plurality of received headers at the different locations within the received payload; and
      analyze bits of the plurality of received headers.

12. The system of claim 11, wherein the first device is further configured to:
   insert a first identical header of the plurality of identical headers at a beginning and a second identical header of the plurality of identical headers at an end of the payload.

13. The system of claim 11, wherein the first device is further configured to:
   insert an identical header of the plurality of identical headers at substantially a middle of the payload.

14. The system of claim 11, wherein the different locations of the plurality of identical headers are positioned at the maximum burst length apart from one another.

15. The system of claim 11, wherein the second device is further configured to:
   determine that a first received header of the plurality of received headers is different than a second received header of the plurality of received headers; and
   select the first received header based on bits of a third received header having a same value as bits of the first received header.

* * * * *